(12) United States Patent
Gridelet et al.

(10) Patent No.: US 9,269,706 B2
(45) Date of Patent: Feb. 23, 2016

(54) METHOD OF PROCESSING A SILICON WAFER AND A SILICON INTEGRATED CIRCUIT

(71) Applicant: NXP B.V., Eindhoven (NL)

(72) Inventors: Evelyne Gridelet, Omal (BE); Hans Mertens, Leuven (BE); Michiel Jos van Duuren, Valkenswaard (NL); Tony Vanhoucke, Bierbeek (BE); Viet Thanh Dinh, Heverlee (BE)

(73) Assignee: NXP, B.V., Eindhoven (NL)

( * ) Notice: Subject to any disclaimer, the term of this patent is extended or adjusted under 35 U.S.C. 154(b) by 63 days.

(21) Appl. No.: 14/098,923

(22) Filed: Dec. 6, 2013

(65) Prior Publication Data
US 2014/0167055 A1    Jun. 19, 2014

(30) Foreign Application Priority Data

Dec. 18, 2012  (EP) .................................... 12197808

(51) Int. Cl.
| | |
|---|---|
| H01L 21/8238 | (2006.01) |
| H01L 27/06 | (2006.01) |
| H01L 21/8249 | (2006.01) |
| H01L 27/115 | (2006.01) |

(52) U.S. Cl.
CPC ........ *H01L 27/0623* (2013.01); *H01L 21/8249* (2013.01); *H01L 27/11546* (2013.01)

(58) Field of Classification Search
CPC ..................... H01L 27/11546; H01L 27/0623; H01L 21/8249
USPC ........................................................ 438/205
See application file for complete search history.

(56) References Cited

U.S. PATENT DOCUMENTS

| | | | |
|---|---|---|---|
| 5,005,066 A | | 4/1991 | Chen |
| 5,248,624 A | * | 9/1993 | Icel et al. ............... 438/201 |
| 6,069,389 A | | 5/2000 | Sasaki |
| 6,169,007 B1 | | 1/2001 | Pinter |
| 6,277,723 B1 | | 8/2001 | Shih et al. |
| 7,074,685 B2 | | 7/2006 | Magnee et al. |
| 2012/0037914 A1 | | 2/2012 | Vanhoucke et al. |
| 2012/0132961 A1 | | 5/2012 | Vanhoucke et al. |
| 2012/0168908 A1 | | 7/2012 | Vanhoucke et al. |

(Continued)

FOREIGN PATENT DOCUMENTS

| | | |
|---|---|---|
| EP | 0 354 457 A2 | 2/1990 |
| EP | 2 418 681 A1 | 2/2012 |
| EP | 2 506 297 A1 | 10/2012 |

(Continued)

OTHER PUBLICATIONS

Kotaki, H. et al., "Novel Elevated Silicide Source/Drain (ESSOD) by Load Lock LPCVD-si and Advanced Silicidation Processing", IEEE, International Electron Device Meeting, pp. 839-842 (Dec. 1993).

(Continued)

*Primary Examiner* — Trung Q Dang

(57) ABSTRACT

Methods and systems for processing a silicon wafer are disclosed. A method includes providing a flash memory region in the silicon wafer and providing a bipolar transistor with a polysilicon external base in the silicon wafer. The flash memory region and the bipolar transistor are formed by depositing a single polysilicon layer common to both the flash memory region and the bipolar transistor.

16 Claims, 6 Drawing Sheets

(56) References Cited

U.S. PATENT DOCUMENTS

2014/0298004 A1* 10/2014 Ellis ............... G06F 9/4411
  713/100
2014/0337233 A1* 11/2014 Phillips ........... G06Q 20/3278
  705/67

FOREIGN PATENT DOCUMENTS

| JP | 2003-249579 A | 9/2003 |
| WO | 97/36332 A1 | 10/1997 |
| WO | 03/100845 A1 | 12/2003 |
| WO | 2010/010482 A2 | 1/2010 |
| WO | 2010/058379 A2 | 5/2010 |

OTHER PUBLICATIONS

Extended European Search Report for EP Patent Appln. No. 12197808.4 (May 15, 2013).

* cited by examiner

METHOD OF PROCESSING A SILICON WAFER AND A SILICON INTEGRATED CIRCUIT

CROSS-REFERENCE TO RELATED APPLICATIONS

This application claims the priority under 35 U.S.C. §119 of European patent application no. 12197808.4, filed on Dec. 18, 2012, the contents of which are incorporated by reference herein.

The present disclosure relates to the field of processing silicon wafers, and in particular but not exclusively to processing a silicon wafer to fabricate a flash memory device and one or more transistors, in particular bipolar transistors.

It can be advantageous to have different kinds of device on the same integrated circuit (also referred to as a chip). However, this is sometimes not possible and can be difficult to achieve.

According to an aspect of the invention there is provided a method of processing a silicon wafer. The method comprises providing a flash memory region in the silicon wafer and providing a bipolar transistor with a polysilicon external base in the silicon wafer. Providing the flash memory region and providing the bipolar transistor comprises a step of depositing a single polysilicon layer common to both the flash memory region and the bipolar transistor.

By using a single polysilicon layer deposition to form part of more than one component, that is, form part of the flash memory region and part of a bipolar transistor in the same deposition step, the overall process flow for manufacturing a silicon wafer including the different components is simplified and the number of steps required overall to process the silicon is reduced. A reduction in the number of processing steps provides a significant advantage in the field of silicon processing.

The step of depositing the single polysilicon layer may comprise forming the polysilicon external base of the bipolar transistor. The bipolar transistor may be a vertical bipolar transistor. The flash memory region may comprise a flash memory device, and a complementary metal-oxide-semiconductor (CMOS) device such as an nMOS and/or a pMOS. Thus advantageously, one or more vertical bipolar transistors may be fabricated on the same silicon wafer as a flash memory region/device in an efficient process flow.

The bipolar transistor may comprise a vertical PNP bipolar transistor. Depositing the single polysilicon layer may comprise forming the polysilicon external base of the vertical PNP bipolar transistor. Thus advantageously vertical PNP bipolar transistors may be fabricated in the same silicon wafer as a flash memory region/device.

The bipolar transistor may comprise a vertical NPN bipolar transistor. Depositing the single polysilicon layer may comprise forming the polysilicon external base of the vertical NPN bipolar transistor. Thus advantageously vertical NPN bipolar transistors may be fabricated in the same silicon wafer as a flash memory region/device.

Providing the flash memory region in the silicon wafer may comprise providing a complementary metal-oxide-semiconductor device in the flash memory region. Providing the bipolar transistor may comprise providing a vertical NPN bipolar transistor. The step of depositing the single polysilicon layer may comprise depositing the single polysilicon layer common to both the complementary metal-oxide-semiconductor device in the flash memory region and the vertical NPN bipolar transistor.

Providing the bipolar transistor may comprise providing a vertical NPN bipolar transistor and a vertical PNP bipolar transistor. For example, there may be a plurality of vertical NPN bipolar transistors and a plurality of vertical PNP bipolar transistors as well as the flash memory region on a silicon wafer. In certain examples, there may be only vertical NPN bipolar transistors or only vertical PNP bipolar transistors along with the flash memory region. Thus a further advantage is provided by the co-integration of a vertical PNP and a vertical NPN bipolar transistor on the same processed silicon wafer with a flash memory device/region. Flexibility in circuit design is provided by the ability to combine these different devices in the same wafer.

Providing the bipolar transistor may comprise providing a vertical NPN bipolar transistor and a vertical PNP bipolar transistor. The step of depositing the single polysilicon layer may comprise a first step of depositing a first single polysilicon layer common to both the flash memory region and the vertical NPN bipolar transistor and a second step of depositing a second single polysilicon layer common to both the flash memory region and the vertical PNP bipolar transistor. Thus there may be at least two deposition steps, one step common to both forming the flash memory region and forming a vertical NPN bipolar transistor, and another step common to both forming the flash memory region and forming a vertical PNP bipolar transistor. Use of at least one single deposition step in contribution to the fabrication of more than one device reduces process flow complexity, saves time and expertise, and allows for more than one device to be fabricated in the same silicon wafer. More than one single deposition step to contribute to the fabrication of two or more components/devices may be performed.

The bipolar transistor may comprise a vertical PNP bipolar transistor. The step of depositing the single polysilicon layer may comprise depositing the polysilicon external base of the vertical PNP bipolar transistor as a floating gate polysilicon layer and depositing a floating gate polysilicon layer of the flash memory region.

The bipolar transistor may comprise a vertical NPN bipolar transistor. The step of depositing the single polysilicon layer may comprise depositing the polysilicon layer of the vertical NPN bipolar transistor as a logic gate polysilicon layer and depositing a logic gate polysilicon layer of the flash memory region.

Providing the flash memory region of the silicon wafer may comprises depositing a polysilicon layer as a control gate polysilicon layer.

In a further aspect there is provided a method of processing a silicon wafer. The method comprises providing a flash memory region in the silicon wafer and providing a bipolar transistor with a polysilicon external base in the silicon wafer. Providing the flash memory region and providing the bipolar transistor comprise a step of implanting ions to both the flash memory region and the bipolar transistor in a single implant step. By using a single implant step to contribute to the fabrication of more than one device/component in the silicon chip, advantageously time, effort and costs are reduced in producing the processed multi device/component type silicon wafer.

Providing the flash memory region and providing the bipolar transistor may comprise a step of implanting ions to both the flash memory region and the bipolar transistor in a single implant step.

Providing the flash memory region may comprise providing an N-well in the flash memory region. Providing the bipolar transistor may comprise providing a vertical NPN bipolar transistor having an N-well. The N-well may be for collector doping. The method may comprise providing the N-well in the flash memory region and the N-well of the vertical NPN bipolar transistor in a single ion implant step.

Providing the flash memory region may comprise providing a P-well of an n-metal-oxide-semiconductor device in the flash memory region. Providing the bipolar transistor may comprise providing a vertical PNP bipolar transistor having a P-well for collector doping. The method may comprise providing the P-well of the n-metal-oxide-semiconductor device in the flash memory region and the P-well of the vertical PNP bipolar transistor in a single ion implant step.

Providing the bipolar transistor may comprise epitaxially depositing silicon-germanium such that the bipolar transistor comprises a heterojunction bipolar transistor (HBT). An HBT may operate faster than a non-HBT bipolar transistor. The method advantageously allows the co-integration of an HBT in the process flow with only a minimal number of extra masks being required. Thus costs, expertise, equipment and time required for mask fabrication and for lithography are reduced by requiring fewer masks to fabricate the bipolar transistor as an HBT. Further, if a vertical PNP transistor is fabricated as a bipolar junction transistor (BJT) that is, as a bipolar transistor but not a HBT, then advantageously only one epitaxy step is required. Epitaxy is a relatively difficult and expensive process, thus reducing the requirement for epitaxy is desirable.

Any method disclosed herein may be combined with any other method disclosed herein.

In a further aspect there is provided a silicon integrated circuit comprising a flash memory region and a bipolar transistor with a polysilicon external base in a processed silicon wafer. Such a silicon integrated circuit may be fabricated according to any method disclosed herein. Such a silicon chip may be used as a logic device, for example, for use in a TV tuner.

In a further aspect there is provided a computer program, which when run on a computer, causes the computer to configure any apparatus to perform any method disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium, which may be a physical computer readable medium such as a disc or a memory device, or may be embodied as a transient signal. Such a transient signal may be a network download, including an internet download.

A description is now given, by way of example only, with reference to the accompanying drawings, in which.

Figure 5A:
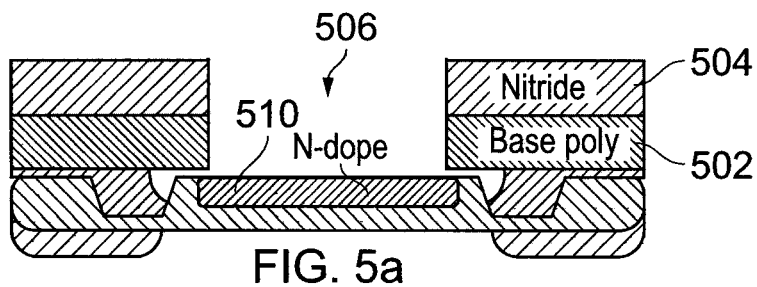
Figure 5B:
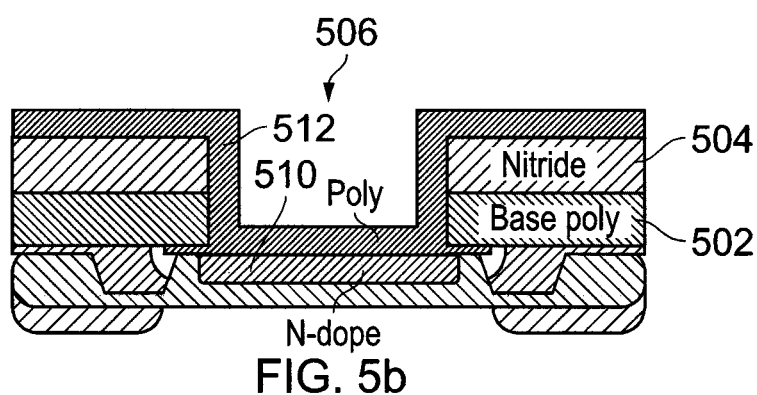
Figure 5C:
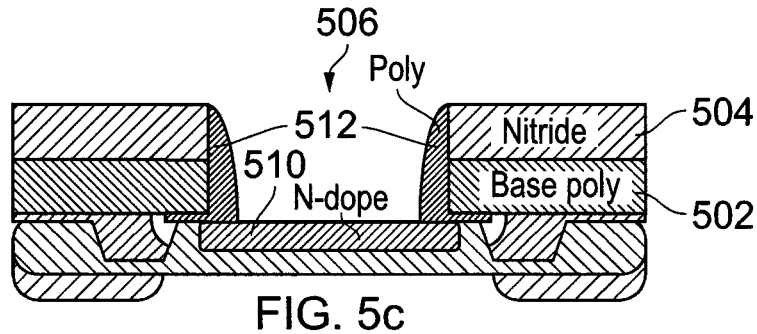
Figure 5D:
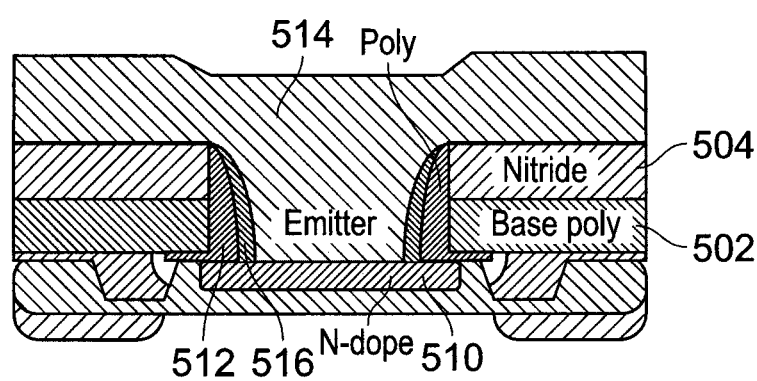
Figure 5E:
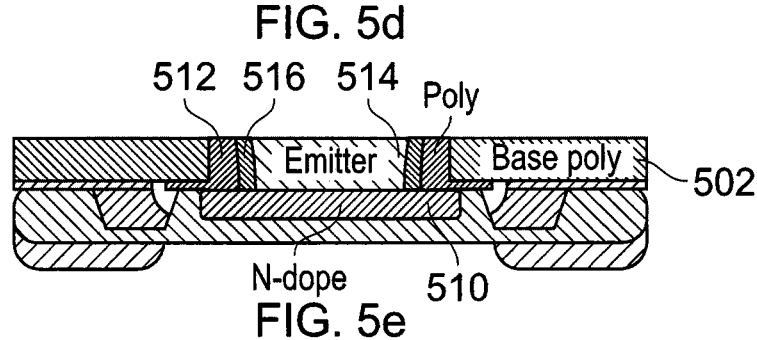
Figure 6A:
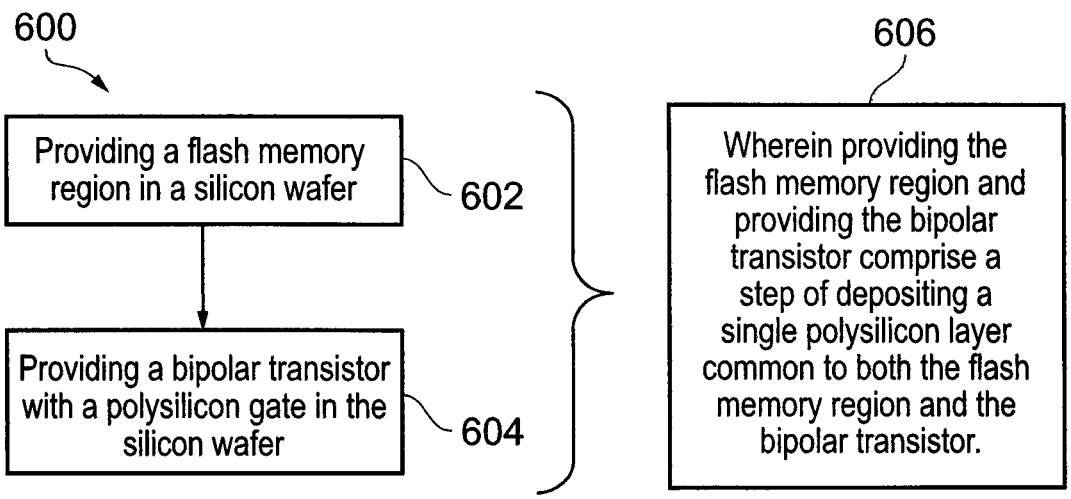
Figure 6B:
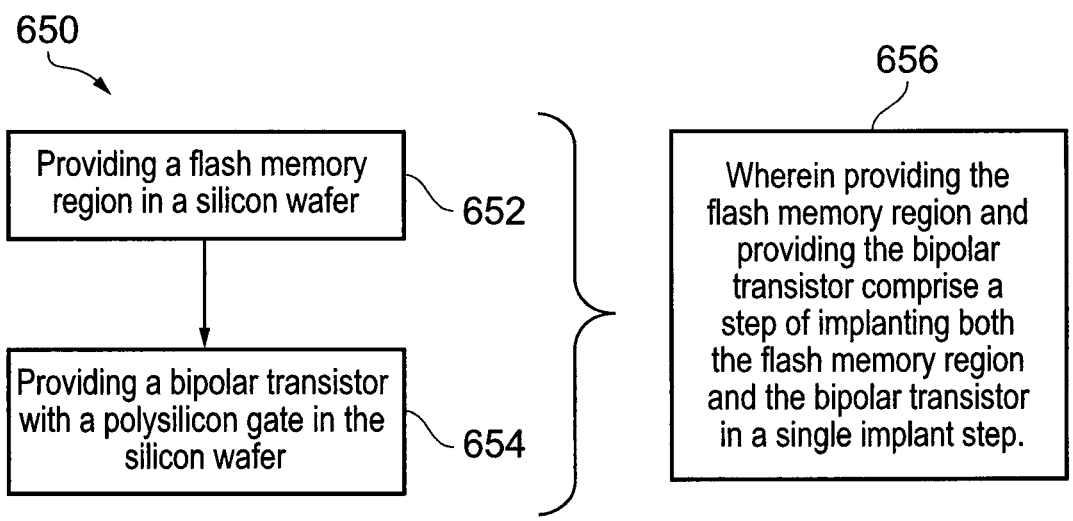

FIGS. 5a-5e also illustrate cross sectional schematic views of a silicon wafer being further processed to form a vertical PNP bipolar transistor according to an embodiment of the invention; and FIGS. 6a-6b illustrate methods according to embodiments of the invention.

Radio frequency (RF) circuits, including advanced RF complementary metal-oxide-semiconductor (RFCMOS) technologies, are capable of achieving high RF performances, but may have a high price per mask-set. This may limit their use in industries which are required to produce chips/integrated circuits (ICs) at a relatively low volume. It is possible to fabricate small-signal RF products, for example based on a 0.25 µm node, which deliver high RF performance and offer a wide set of passive components, but at the cost of seven to eight additional masks on top of those required to fabricate CMOS for a silicon-germanium (SiGe) heterojunction bipolar transistor (HBT). Some applications, such as TV tuners, require a smaller node than 0.25 µm for logic, but also require good RF capabilities at a reasonable price. Low-complexity heterojunction bipolar transistors (LC-HBTs) can be used to meet this need. The provision of LC-HBTs are discussed in U.S. Pat. No. 7,074,685 B2.

The provision of a LC-HBT process requires extra process steps in the process flow of fabricating a CMOS transistor or a flash memory device just after the deposition of a polysilicon gate in order to create an HBT. Low complexity (LC) may be taken to mean that a vertical LC-HBT requires a minimum number of integration steps with respect to a standard CMOS, and uses the polysilicon gate for the external base. Examples of LC-HBTs are described herein. This process usually requires two to four additional masks compared with a standard flow for a CMOS transistor and does not substantially affect the CMOS performance.

The LC-HBT flow is based on a standard CMOS flow, with only one polysilicon gate layer. However, a flash flow process for fabrication of flash/non-volatile memory can involve three different polysilicon gate layers and several different implant stages. The integration of an LC-HBT device in a flash memory process flow is not straightforward, especially if it is desired to include a PNP bipolar transistor in the process. This is, at least in part, because it is difficult to ensure that consecutive steps in the flow process for making one type of device are compatible with the steps required in the flow process for making another type of device in the same silicon wafer. It may also not be straightforward to reduce the number of overall steps to reduce manufacture time, skill required, complexity of processing and manufacturing costs.

There is an advantage is combining bipolar transistors (non-HBT and HBT, both NPN and PNP) and non-volatile memory/flash onto a single silicon wafer. For example, a designer working on a high-speed transceiver may feel that CMOS RF performances and power consumption in a flash process flow may be insufficient for his application and would like to have NPN/PNP bipolar transistors available. Further, the possibility of integrating more options, such as non-volatile memories in a BiCMOS flow (combining bipolar transistors and CMOS devices) is attractive. The combination of such options may not necessarily be thought to be compatible, as extra process steps are required to fabricate the different devices (NPN and PNP bipolar transistors as well as nMOS and pMOS devices) in the same silicon substrate/wafer.

Embodiments disclosed herein may be considered to provide an advantageous method for combining different options in the same process flow, which may not previously have been expected to be successful. For example, options can be included in the process flow for fabricating a combination of devices on the same silicon wafer. One option is to fabricate non-volatile memory (NVM), which includes flash memory. Another option is to include steps for fabrication of complementary metal-oxide-semiconductor devices (CMOS) such as n-type metal-oxide-semiconductor (nMOS) and/or p-type metal-oxide-semiconductor (pMOS) devices in the same process flow as for the flash memory. Another option is to include a bipolar transistor flow process to fabricate an NPN and/or a PNP vertical bipolar transistor. A further option is to include a heterojunction bipolar transistor (HBT) flow process to fabricate an NPN and/or a PNP vertical heterojunction bipolar transistor. If the bipolar transistor is fabricated in silicon then a BJT bipolar transistor can be obtained. If an epitaxial silicon-germanium layer is included as the base then an HBT can be obtained. An HBT may operate faster than a BJT bipolar transistor.

Thus embodiments disclosed herein that combine two or more of flash, a CMOS device (which may be considered a unipolar transistor) and a bipolar transistor (BJT or HBT) may be considered to represent an improved trade-off between logic performance, RF performance and cost, and provide a combination of HBT and non-volatile/flash memory.

Fabrication of a flash memory structure/device can also be performed to fabricate, for example, one or more nMOS, and/or pMOS transistors. According to embodiments disclosed herein, a flash memory region/device may be fabricated on the same silicon wafer as one or more vertical NPN and/or vertical PNP vertical bipolar transistors (non-HBT or HBT). By clever re-use of one or more polysilicon layer depositions and implants which are already required in the flash memory region process flow, a vertical NPN bipolar transistor and/or a vertical PNP bipolar transistor can be efficiently and economically integrated in the silicon wafer. Identifying and using processing steps that are common to processing flows for different devices is key to the efficiency of the combined flow process and allows for re-use of masks and implants to improve the efficiency of the combined flow process. Steps such as depositing a polysilicon layer to form both part of the flash memory device and a external base of a bipolar transistor allow for a flash memory device and a vertical NPN and/or vertical PNP bipolar transistor to be fabricated on the same silicon wafer in the same procedure, while reducing the number of complex and expensive processing steps.

In a silicon process flow, masks are used for lithography, which is a very expensive process with regard to materials, required expertise and machinery, and processing costs. One or more embodiments disclosed herein can minimise or reduce the number of masks needed by re-using a single mask to make implants, in different devices, optionally simultaneously.

Also, in a silicon process flow, epitaxy may be used to deposit crystalline layers in a semiconductor process. Epitaxy is also an expensive process with regard to the expertise and machinery required, and to processing costs. One or more embodiments disclosed herein can reduce or minimise the number of epitaxial steps required by designing a process flow as disclosed herein.

Throughout this disclosure, the term "polysilicon" refers to polycrystalline silicon or polycrystalline silicon-germanium.

Figure 1A:
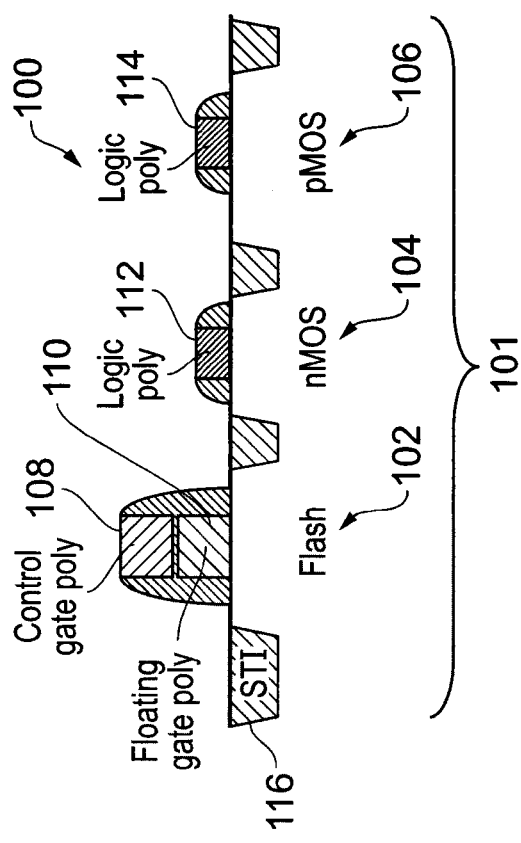
FIG. 1a illustrates a schematic cross section of a silicon wafer with a flash memory region according to an embodiment of the invention.

FIG. 1a illustrates a schematic cross section of a silicon wafer 100 with a flash memory region 101 comprising a flash memory device 102, an nMOS device 104 and a pMOS device 106. Each device 102, 104, 106 may be separated using shallow trench isolation (STI) 116. The flash memory device 102 comprises a control gate polysilicon layer 108 and a floating gate polysilicon layer 110. Each nMOS and pMOS device 104, 106 comprises a logic polysilicon layer 112, 114.

Figure 1B:
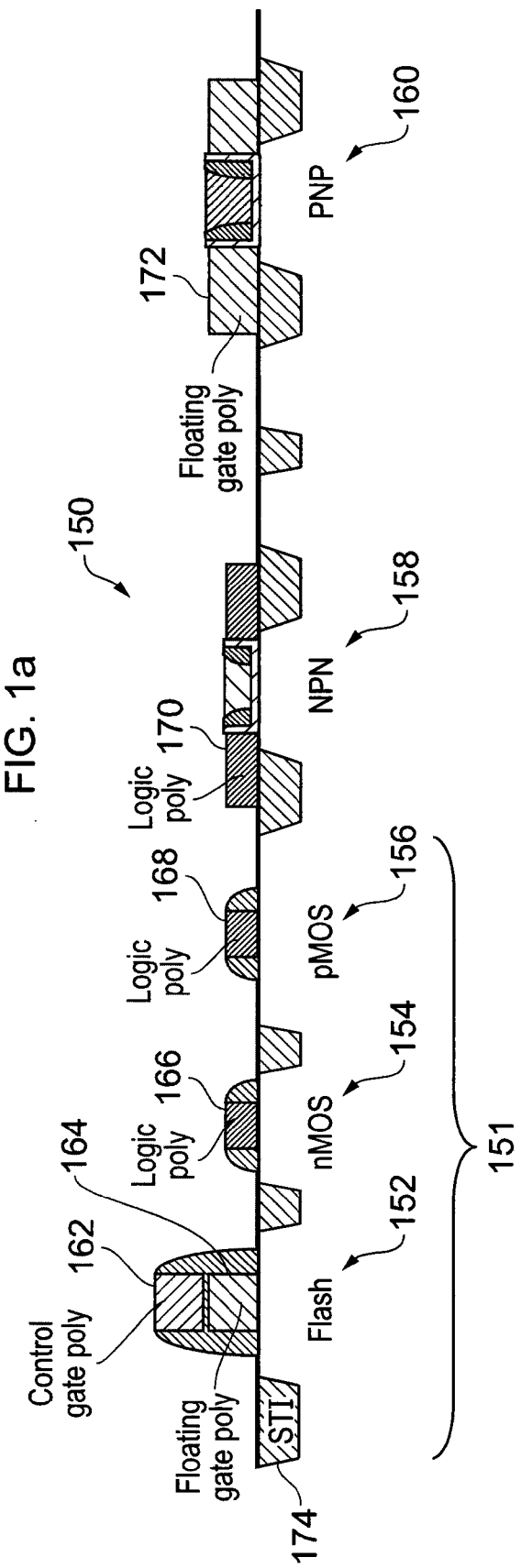
FIG. 1b illustrates a schematic cross section of a silicon wafer with a flash memory region, vertical NPN bipolar transistor and vertical PNP bipolar transistor according to an embodiment of the invention.

FIG. 1b illustrates a schematic cross section of a silicon wafer 100 with a flash memory region 151 comprising a flash memory device 152, an nMOS device 154, a pMOS device 156, a vertical NPN bipolar transistor 158 and a vertical PNP bipolar transistor 160. The flash memory region 151 is the same as that of FIG. 1a. The vertical NPN bipolar transistor 158 comprises a polysilicon layer 170 as a polysilicon external base. The vertical PNP bipolar transistor 160 comprises a polysilicon layer 172 as a polysilicon external base. The fabrication of the vertical PNP bipolar transistor is discussed in more detail in relation to FIGS. 3a-3d, 4a-4d and 5a-5e.

In FIG. 1b, the floating gate polysilicon layer 164 of the flash memory device 152 and the polysilicon external base 172 of the vertical PNP bipolar transistor 160 have been deposited in a single polysilicon layer deposition step. That is, the deposition is common to both the flash memory region 151 formation and the vertical PNP bipolar transistor 160 formation. Also, the logic polysilicon layers 166, 168 of the nMOS device 154 and pMOS device 156, and the polysilicon external base 170 of the vertical NPN bipolar transistor 158 have been deposited in a single polysilicon layer deposition step, which is common to the flash memory region 151 formation and the vertical NPN bipolar transistor 158 formation.

Figure 2A:
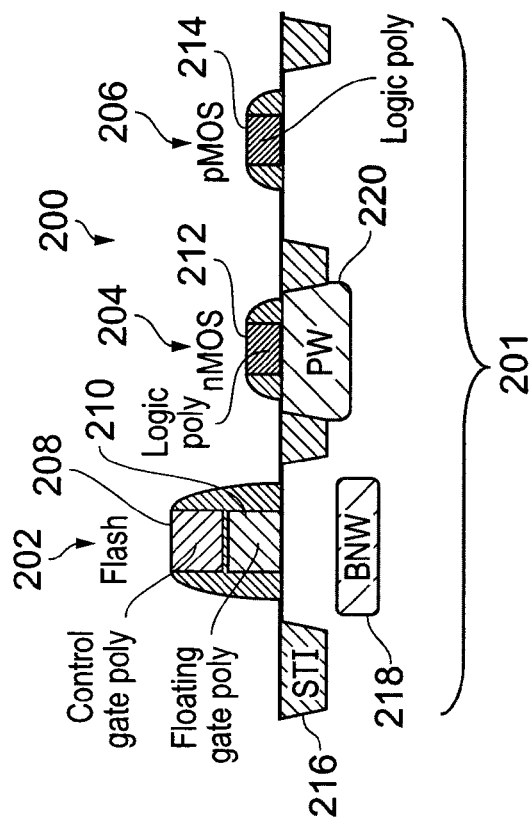
FIG. 2a illustrate a schematic cross section of a silicon wafer with a flash memory region according to an embodiment of the invention.

FIG. 2a is similar to FIG. 1a and illustrates a schematic cross section of a silicon wafer 200 with a flash memory region 201 comprising a flash memory device 202, an nMOS device 204 and a pMOS device 206 separated using STI 216. The flash memory device 202 comprises a control gate polysilicon layer 208, a floating gate polysilicon layer 210 and a buried N-well 218 in the silicon substrate. The nMOS device 204 comprises a logic polysilicon layer 212 and a P-well 220 in the silicon substrate. The pMOS device 106 comprises a logic polysilicon layer 214.

Figure 2B:
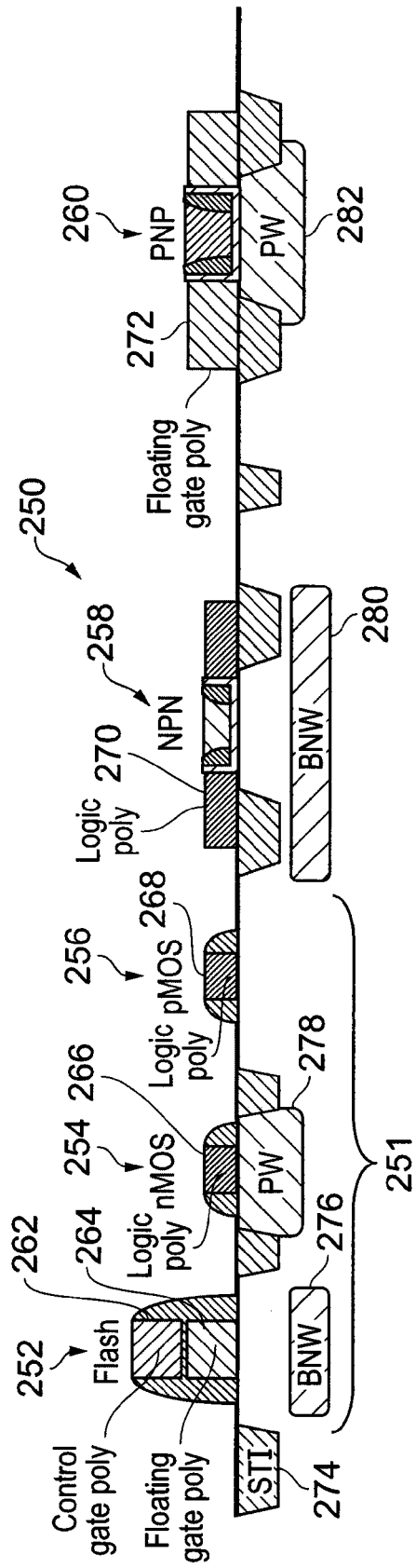
FIG. 2b illustrates a schematic cross section of a silicon wafer with a flash memory region, vertical NPN bipolar transistor and vertical PNP bipolar transistor according to an embodiment of the invention.

FIG. 2b is similar to FIG. 1b and illustrates a schematic cross section of a silicon wafer 200 with a flash memory region 251 comprising a flash memory device 252, an nMOS device 254, a pMOS device 256, a vertical NPN bipolar transistor 258 and a vertical PNP bipolar transistor 260. The flash memory region 251 is the same as that of FIG. 2a. The vertical NPN bipolar transistor 258 comprises a polysilicon layer 270 as a polysilicon external base and a buried N-well 280 in the silicon substrate. The vertical PNP bipolar transistor 260 comprises a polysilicon layer 272 as a polysilicon external base and a P-well 282 in the silicon substrate.

In FIG. 2b the polysilicon layer deposition in the flash memory region and NPN and PNP bipolar transistors 258, 260 is the same as that of FIG. 1b. In addition, the buried N-well 276 of the flash memory device 252 has been fabricated in the same implant step as the buried N-well 280 of the vertical NPN bipolar transistor 258. Also, the P-well 278 of the nMOS device 254 in the flash memory region has been fabricated in the same implant step as the P-well 282 of the vertical PNP bipolar transistor 260.

The proposed methods illustrated in FIGS. 1a-1b and 2a-2b advantageously allow a single polysilicon deposition step to be used to provide layers in both the flash memory region 101, 151; 201, 251 and in a bipolar transistor 158, 160;

280, 282, thereby simplifying the processing of a silicon wafer to include both a flash memory region 101, 151; 201, 251 and a bipolar transistor 158, 160; 280, 282. In addition the method advantageously allows a single implant step to contribute to the fabrication of more than one device by forming a buried N-well for both the flash memory device 252 and the vertical NPN bipolar transistor 458, and forming a P-well 276 of the nMOS device 254 in the flash memory region and a P-well 282 of the vertical PNP bipolar transistor 360. Thus time, effort and costs are reduced by producing the processed silicon wafer using a single implant step to contribute to the production of more than one device/component in the silicon wafer.

FIGS. 1a-1b and 2a-2b each illustrate one of each type of device. More than one of each type of device/component may be provided on the same silicon wafer. In other examples, only vertical NPN bipolar transistors, or only PNP bipolar transistors, rather than both NPN and PNP types, may be provided.

It will be appreciated the features shown in each of FIGS. 1a, 1b, 2a and 2b can be combined such that one or more of a selection of the devices illustrated may be fabricated in a single silicon wafer as required according to methods disclosed herein.

Vertical NPN and/or PNP bipolar transistors can be fabricated efficiently in the same silicon wafer as a flash memory device as described herein. The advantage of including one or both types of bipolar transistor in the same silicon wafer as a flash device provides flexibility of integrated circuit design and manufacture. The bipolar transistor may be fabricated as a BJT which does not require an epitaxial deposition. It is also possible to make an HBT bipolar transistor using a vertical PNP bipolar transistor if desired. This may require a step of epitaxially depositing silicon-germanium to form the base of the HTB. Only one epitaxy step is required if a vertical PNP bipolar transistor is used to form the HBT, which is advantageous because epitaxy is a difficult and relatively expensive process. Therefore reducing the number of epitaxy steps required reduces the need to use epitaxial deposition equipment and expertise, processing time, and costs. It may therefore be advantageous to be able to include a vertical PNP bipolar transistor in the same silicon wafer as a flash memory device to allow an HBT to be made.

It is also possible to fabricate vertical NPN bipolar transistors as either high voltage (HV) or high performance (HP) (that is, low voltage) bipolar transistors. HP and HV NPN bipolar transistors can be made on the same wafer according to methods disclosed herein by using an additional mask on top of those required for an HBT. This is advantageous because HP and HV NPN bipolar transistors may be combined on the same silicon wafer as a flash memory device with a minimal number of additional steps FIGS. 3a-3d show a first set of steps for fabricating a low-complexity (LC) HBT, such as a vertical PNP bipolar transistor. Two variations are illustrated in FIGS. 4a-4d and in FIGS. 5a-5e, each of which continue from the last step of FIG. 3d. The manufacturing process steps shown in FIGS. 3a-3d, 4a-4d and 5a-5e are standard in silicon technology and will not necessarily be explained in great detail.

Figure 3A:
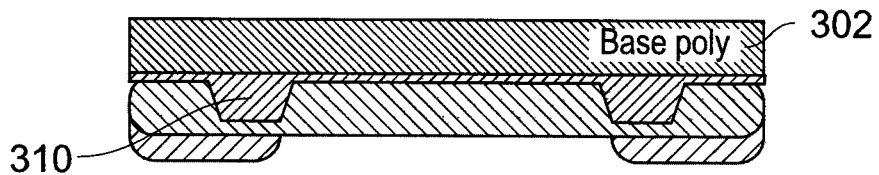
FIGS. 3a-3d illustrate cross sectional schematic views of a silicon wafer being processed to form a vertical PNP bipolar transistor according to an embodiment of the invention.

FIG. 3a shows a PNP bipolar transistor region with an external base polysilicon layer 302. Shallow trench isolation (STI) 310 is also shown. In examples where a flash memory device/region is also fabricated in the same silicon wafer as the PNP bipolar transistor, the external base polysilicon layer 302 is deposited in the same polysilicon deposition step as that forming a floating gate polysilicon layer in the flash memory region, as illustrated in FIGS. 1-1b and 2a-2b.

Figure 3B:
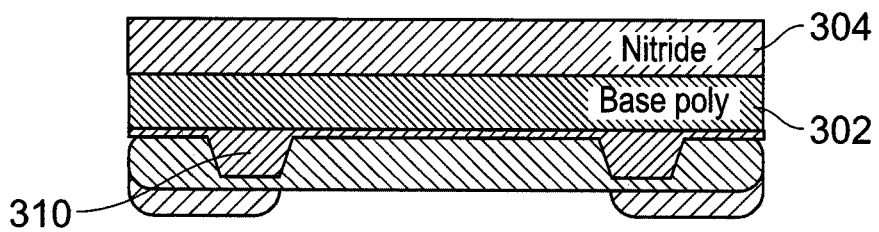

In FIG. 3b, a layer of silicon nitride 304 is deposited over the base polysilicon layer 302.

Figure 3C:
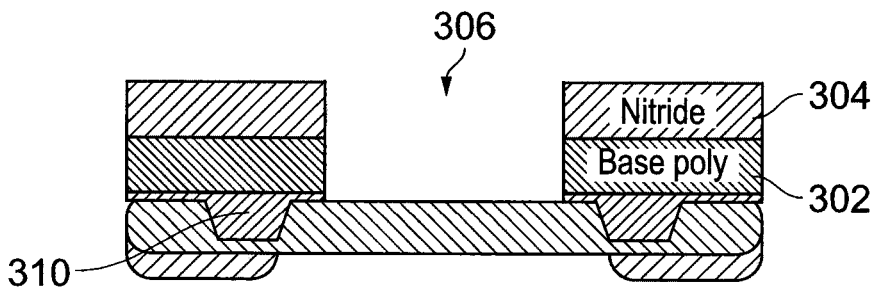

FIG. 3c shows that a window 306 is opened in the silicon nitride 304 and base polysilicon 302 layers.

Figure 3D:
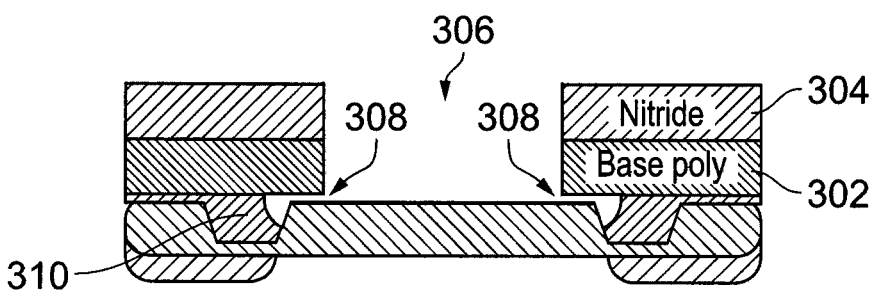

FIG. 3d shows an oxide wet etch step to create space regions 308 at the edge of and partially under the base polysilicon regions 302 within the window 306, by removing part of the base oxide (not shown) and possibly part of the STI 310. The oxide wet etch may typically be a hydrofluoric acid (HF) dip.

The PNP bipolar transistor can continue to be made according to the steps shown in FIGS. 4a-4d, or FIGS. 5a-5e. The main difference between these two schemes is the inclusion of a polysilicon layer 512 in FIGS. 5b-5e.

Features of FIGS. 3a-3d that are also shown in FIGS. 4a-d and 5a-e are given corresponding reference numbers in the 400 series and 500 series respectively.

Figure 4A:
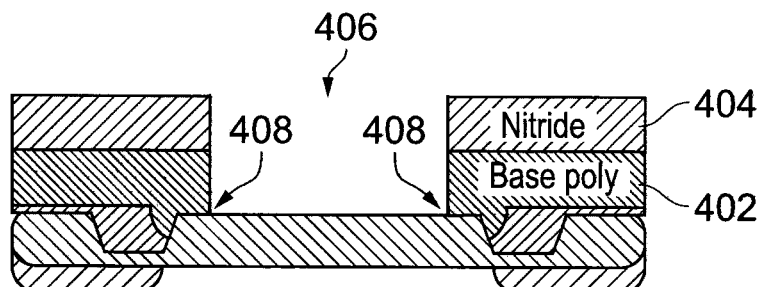
FIGS. 4a-4d illustrate cross sectional schematic views of a silicon wafer being further processed to form a vertical PNP bipolar transistor according to an embodiment of the invention.

FIG. 4a shows that the silicon wafer has been annealed to close the gaps created by the oxide wet etch shown in FIG. 3d The base polysilicon layer 402 reflows to fill the gaps 408.

Figure 4B:
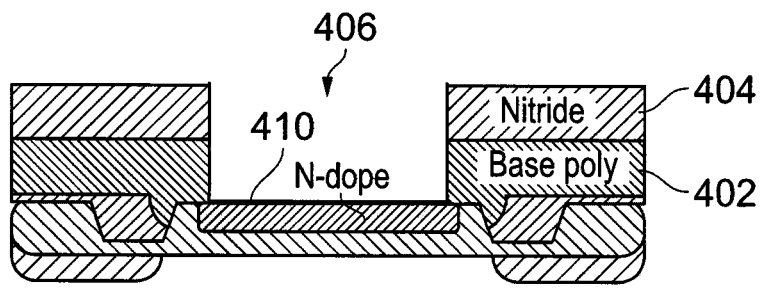

In FIG. 4b, an N-doped emitter 410 is created by base implantation, for example by N-doping using phosphorous or arsenic in the window 406 to make an implanted base. In other example the base implant step may be performed before the anneal of FIG. 4a.

Figure 4C:
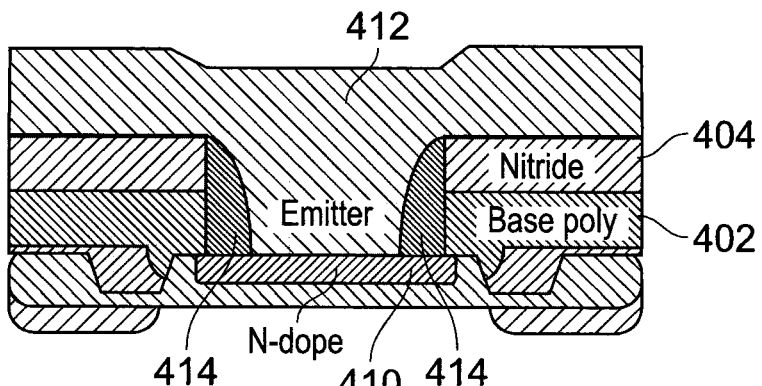

FIG. 4c shows the deposition of spacers 414 within the window 406 which may be a dielectric nitride/oxide layer. Also shown is the deposition of polysilicon emitter material 412 in the window 406.

Figure 4D:
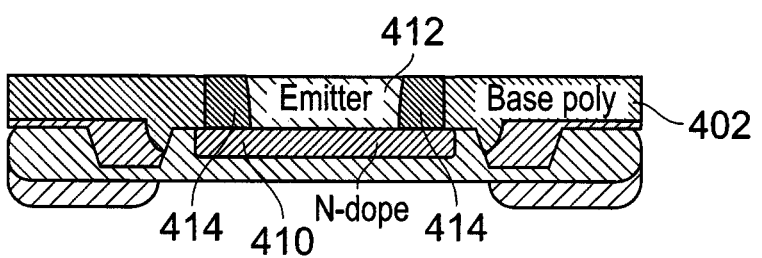

FIG. 4d shows that chemical-mechanical polishing (CMP) has been used to remove all material above the base polysilicon 402 and expose the N-doped emitter 412 and the base poly 402, separated by the spacers 414. The resulting device can be used as a vertical PNP bipolar transistor.

FIG. 5a follows on from FIG. 3d as an alternative to the steps of FIG. 4a-4d. FIG. 5a shows an N doped emitter 510 made by base implantation as described above in relation to FIG. 4b, for example using phosphorous or arsenic.

FIG. 5b shows that a polysilicon layer 512 is deposited to seal the gap between the base poly and the N-doped implanted base 510. The polysilicon layer 512 also lines the walls of the window 506 to cover the N-doped emitter 510 and previously exposed nitride 504 and base polysilicon 502. In other examples the silicon layer 512 may be epitaxially deposited, to form a substantially crystalline silicon layer rather than substantially polysilicon. The deposition of the polysilicon layer 512 should be performed to fill, at least partially, the gap below the base polysilicon 502. A suitable process for depositing this polysilicon layer 512 is low pressure chemical vapour deposition (LP-CVD). In other examples, rather than using polysilicon, poly(silicon-germanium) (polySiGe) may be deposited to form the layer 512.

In FIG. 5c, the polysilicon 512 is etched selectively with respect to the crystalline silicon wafer material. A selective etch of polysilicon 512 with respect to crystalline silicon is possible, but using polySiGe can help to improve the selectivity. No mask is needed for this step as usual in spacer etches. As a result the N-doped emitter 510 is no longer covered by the polysilicon layer 512.

FIG. 5d shows the deposition of dielectric spacers 516 within the window. The dielectric spacers 516 may be a dielectric nitride/oxide layer. FIG. 5d also shows the deposition of polysilicon emitter material 514 in the window.

FIG. 5e shows that CMP has taken place to remove all material above the base polysilicon 504 and expose the polysilicon external base 502 and emitter 514, separated by the dielectric spacers 516.

FIG. 6a illustrates a method of processing a silicon wafer 600 according to embodiments of the invention, comprising providing a flash memory region in the silicon wafer at step 602 and providing a bipolar transistor with a polysilicon external base in the silicon wafer at step 604. The two providing steps 602, 604 are further defined in that providing the flash memory region and providing the bipolar transistor comprise a step of depositing a single polysilicon layer common to both the flash memory region and the bipolar transistor, as shown in FIG. 6a as step 606. That is, both providing steps 602, 604 are performed such that a step of depositing a single polysilicon layer common to both the flash memory region and the bipolar transistor is carried out.

FIG. 6b illustrates a method of processing a silicon wafer 650 according to embodiments of the invention. The method 650 comprises providing a flash memory region in the silicon wafer at step 652 and providing a bipolar transistor with a polysilicon external base in the silicon wafer at step 654. The two providing steps 652, 654 are further defined in that providing the flash memory region and providing the bipolar transistor comprise a step of implanting both the flash memory region and the bipolar transistor in a single implant step 656. That is, both providing steps 652, 654 are performed such that a step of implanting a region common to both the flash memory region and the bipolar transistor is carried out. For example, a buried N-well may be formed in the flash memory region and also in a vertical NPN bipolar transistor in a single implantation step. As another example, a P-well may be formed in the flash memory region in an nMOS device, and also in a vertical PNP bipolar transistor, in the same implantation step.

The invention claimed is:

1. A method of processing a silicon wafer comprising:
providing a flash memory region in the silicon wafer; and
providing a bipolar transistor with a polysilicon external base in the silicon wafer;
wherein providing the flash memory region and providing the bipolar transistor comprise a step of depositing a single polysilicon layer common to both the flash memory region and the bipolar transistor, and wherein providing the bipolar transistor comprises providing a vertical NPN bipolar transistor and a vertical PNP bipolar transistor.

2. The method of processing a silicon wafer of claim 1, wherein the step of depositing the single polysilicon layer comprises forming the polysilicon external base of the bipolar transistor.

3. The method of processing a silicon wafer of claim 1, wherein the bipolar transistor comprises the vertical PNP bipolar transistor, and depositing the single polysilicon layer comprises forming the polysilicon external base of the vertical PNP bipolar transistor.

4. The method of processing a silicon wafer of claim 1, wherein the bipolar transistor comprises the vertical NPN bipolar transistor, and depositing the single polysilicon layer comprises forming the polysilicon external base of the vertical NPN bipolar transistor.

5. The method of processing a silicon wafer of claim 4, wherein:
providing the flash memory region in the silicon wafer comprises providing a complementary metal-oxide-semiconductor device in the flash memory region; and
the step of depositing the single polysilicon layer comprises depositing the single polysilicon layer common to both the complementary metal-oxide-semiconductor device in the flash memory region and the vertical NPN bipolar transistor.

6. The method of processing a silicon wafer of claim 1, wherein:
the step of depositing the single polysilicon layer comprises:
depositing a first single polysilicon layer common to both the flash memory region and the vertical NPN bipolar transistor and;
depositing a second single polysilicon layer common to both the flash memory region and the vertical PNP bipolar transistor.

7. The method of processing a silicon wafer of claim 1, wherein the bipolar transistor comprises the vertical PNP bipolar transistor, and the step of depositing the single polysilicon layer comprises depositing the polysilicon external base of the vertical PNP bipolar transistor as a floating gate polysilicon layer and depositing a floating gate polysilicon layer in the flash memory region.

8. The method of processing a silicon wafer of claim 1, wherein the bipolar transistor comprises the vertical NPN bipolar transistor, and the step of depositing the single polysilicon layer comprises depositing the polysilicon layer of the vertical NPN bipolar transistor as a logic polysilicon layer and depositing a logic gate polysilicon layer in the flash memory region.

9. The method of processing a silicon wafer of claim 1, wherein providing the flash memory region and providing the bipolar transistor comprise a step of implanting ions to both the flash memory region and the bipolar transistor in a single implant step.

10. The method of processing a silicon wafer of claim 1, wherein:
providing the flash memory region comprises providing a N-well in the flash memory region; and
providing the bipolar transistor comprises providing the vertical NPN bipolar transistor having an N-well; the method comprising:
providing the N-well in the flash memory region and the N-well of the vertical NPN bipolar transistor in a single ion implant step.

11. The method of processing a silicon wafer of claim 1, wherein:
providing the flash memory region comprises providing a P-well of an n-metal-oxide-semiconductor device in the flash memory region; and
providing the bipolar transistor comprises providing the vertical PNP bipolar transistor having a P-well; the method comprising:
providing the P-well of the n-metal-oxide-semiconductor device in the flash memory region and the P-well of the vertical PNP bipolar transistor in a single ion implant step.

12. The method of processing a silicon wafer of claim 1, wherein providing the bipolar transistor comprises epitaxially depositing silicon-germanium such that the bipolar transistor comprises a heterojunction bipolar transistor.

13. A method of processing a silicon wafer comprising:
providing a flash memory region in the silicon wafer; and
providing a bipolar transistor with a polysilicon external base in the silicon wafer;
wherein providing the flash memory region and providing the bipolar transistor comprise a step of depositing a single polysilicon layer common to both the flash memory region and the bipolar transistor, wherein the bipolar transistor comprises one of a vertical NPN bipolar transistor and a vertical PNP bipolar transistor, and depositing the single polysilicon layer comprises forming the polysilicon external base of the one of the vertical NPN bipolar transistor and the vertical PNP bipolar transistor, wherein providing the flash memory region in the silicon wafer comprises providing a complementary metal-oxide-semiconductor device in the flash memory region; and the step of depositing the single polysilicon layer comprises depositing the single polysilicon layer common to both the complementary metal-oxide-semiconductor device in the flash memory region and the one of the vertical NPN bipolar transistor and the vertical PNP bipolar transistor.

14. The method of processing a silicon wafer of claim 13, wherein the bipolar transistor comprises the vertical NPN bipolar transistor, and depositing the single polysilicon layer comprises forming the polysilicon external base of the vertical NPN bipolar transistor.

15. The method of processing a silicon wafer of claim 13, wherein the bipolar transistor comprises the vertical PNP bipolar transistor, and depositing the single polysilicon layer comprises forming the polysilicon external base of the vertical PNP bipolar transistor.

16. A method of processing a silicon wafer comprising:
providing a flash memory region in the silicon wafer; and
providing a bipolar transistor with a polysilicon external base in the silicon wafer;
wherein providing the flash memory region and providing the bipolar transistor comprise a step of depositing a single polysilicon layer common to both the flash memory region and the bipolar transistor, wherein the bipolar transistor comprises a vertical NPN bipolar transistor, and the step of depositing the single polysilicon layer comprises depositing the polysilicon layer of the vertical NPN bipolar transistor as a logic polysilicon layer and depositing a logic gate polysilicon layer in the flash memory region.

* * * * *